United States Patent [19]

Bobeck et al.

[11] 4,025,911
[45] May 24, 1977

[54] MAGNETIC BUBBLE MEMORY BIAS MAGNET ARRANGEMENT

[75] Inventors: Andrew Henry Bobeck, Chatham; Roman Kowalchuk, Bridgewater, both of N.J.

[73] Assignee: Bell Telephone Laboratories, Incorporated, Murray Hill, N.J.

[22] Filed: Oct. 23, 1975

[21] Appl. No.: 625,319

[52] U.S. Cl. .................. 340/174 TF; 335/306
[51] Int. Cl.² ............... G11C 11/02; H01F 7/02
[58] Field of Search ............ 340/174 TF, 174 OA

[56] References Cited
UNITED STATES PATENTS 3,744,042  7/1973  Cutter ..................... 340/174 TF
3,864,671  2/1975  Myer ....................... 340/174 TF

OTHER PUBLICATIONS

Lyons, Permanent Magnet Bias Schemes for Bubble Memory Application, TR22-1633, IBM, 5-73 14 pp.

*Primary Examiner*—Thomas B. Habecker
*Attorney, Agent, or Firm*—Herbert M. Shapiro

[57] ABSTRACT

An in-plane magnetic holding field, long known to provide improved operating margins for a magnetic bubble memory during stop-start operation, is produced by unique bias magnet designs each of which provides a constant in-plane bias field in a manner consistent with normal bubble propagation as well as with stop-start operation.

10 Claims, 3 Drawing Figures

MAGNETIC BUBBLE MEMORY BIAS MAGNET ARRANGEMENT

FIELD OF THE INVENTION

This invention relates to magnetic bubble memories and more particularly to permanent magnetic biasing arrangements for such memories.

BACKGROUND OF THE INVENTION

Magnetic bubble memories are known to operate in a familiar field-access mode. Memories of this type are characterized by a pattern of magnetic elements, typically magnetically soft permalloy, which respond to a magnetic field rotating in a plane of bubble movement to generate a pattern of localized magnetic field gradients. A magnetic bias field, antiparallel to the magnetization of a bubble and normal to the plane of bubble movement is present to provide a range of stability over which a bubble memory is operable.

A highly attractive feature of a bubble memory is its nonvolatility. That is to say that a bubble pattern representative of information remains undisturbed in the absence of a drive field. Thus, power to a bubble memory may be interrupted without the loss of information.

Yet, information may be disturbed in a bubble memory during the transients which occur when the drive field stops and starts. For example, a bubble pattern may occupy a particular set of positions with respect to the permalloy pattern when the drive field stops and the field may later start in orientation consistent with the occupation of different positions. Ambiguous movement of information results. Consequently, it has been found to be helpful, if a power failure occurs, for the drive circuitry to be adapted to ensure movement of information to closest safe positions and that the drive field next be activated in an orientation consistent with the occupation of those positions.

It has also long been known that an in-plane (holding) field improves the stability of bubble patterns during stop-start operation. Such a field is oriented in a direction, in the plane of bubble movement, consistent with the occupation of safe positions by a bubble pattern. The result is improved operating margins and yield in the manufacture of bubble packages.

Since the presence of the holding field has been thought to be helpful only during stop-start operation, its presence during normal operation was considered of little, if any, positive value. Since that presence causes a variation in the drive field amplitude, its elimination during operation has been thought desirable. Thus, U.S. Pat. No. 3,744,042, issued July 3, 1973, discloses the canting of the magnetic bias field-generating means with respect to the plane of bubble movement in order to provide a holding field. But, the patent also shows a circuit powered by the drive field power supply which provides a field equal and antiparallel to the holding field. During normal operation, the net result is that these two fields ideally cancel. Yet, when drive power terminates, so does the antiparallel field leaving the holding field to ensure bubble stability.

As to the canting of the bias magnet with respect to the plane of bubble movement, increased package size and individual attention to each package are necessary for devices so arranged. For example, a bias field for a bubble device is supplied, typically, by a Watson magnet. Such a magnet comprises four elements abutting one another to form a rectangular arrangement. One pair of parallel elements comprises permanent magnets, typically high coercive force INDOX. The remaining pair of elements comprises soft ferrite keepers. The magnetization of each INDOX element is saturated parallel to the faces of the element, the overall arrangement being adapted to supply a uniform field parallel to the INDOX elements within the cavity formed by the rectangular array. The plane of bubble movement is placed in that cavity and the canting of the magnet requires increased volume within the overall package and a tailored angle depending on the individual chip characteristics. The procedure moreover is difficult to adapt to mass production.

BRIEF DESCRIPTION OF THE INVENTION

The present invention is based on the recognition that a permanent in-plane field, if properly aligned with respect to the permalloy pattern, can be used to improve margins during normal bubble propagation as well as during stop-start operation. The field is particularly helpful when adapted to compensate for the characteristic displacement in the center of the nominally circular rotating field of a bubble, field access device.

The invention is directed at a modified bias magnet geometry. In one embodiment, the soft ferrite keepers are offset with respect to one another to extend beyond the planes of the INDOX elements. In another embodiment, the magnetization in the INDOX elements is magnetized at an angle with respect to the faces of the elements. In each embodiment, dipoles are formed which generate an in-plane field. Proper orientation of the plane of bubble movement within the cavity of the magnet produces enhanced operating margins which manifests themselves as improved yields and thus lower cost of manufacture. An alternative flat pack permanent bias structure, particularly useful for multiple chip packages, is disclosed in copending application, Ser. No. 629,006 filed Nov. 5, 1975 for P. C. Michaelis.

DETAILED DESCRIPTION

Figure 1:
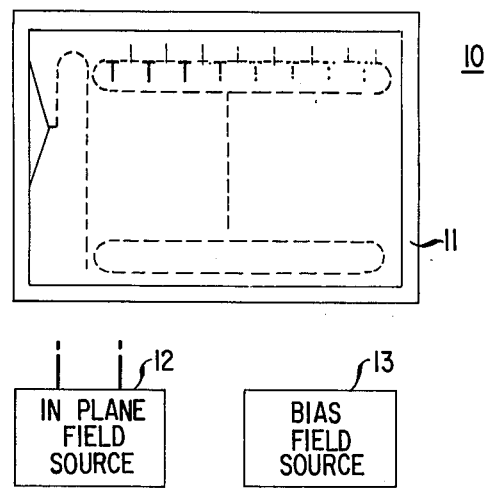
FIG. 1 is a block diagram of a portion of a magnetic bubble memory.

FIG. 1 shows a magnetic bubble memory 10 including a plane 11 of bubble movement. The plane of bubble movement is defined, illustratively, by an epitaxially grown film on a nonmagnetic garnet substrate. Alternatively, an amorphous metal alloy film can be used. The film is characterized by a uniaxial anisotropy normal to the plane of the film. We will adopt the convention that a bubble has its south pole directed upward towards the viewer in FIG. 1. The north or plus pole is directed downward.

A pattern of magnetically soft permalloy elements is formed in a familiar manner on the surface of film 11 typically on an oxide or nitride spacing layer. The most familiar pattern is the T and bar-shaped pattern shown in the figure. The elements are arranged in closed (minor) loops as indicated by the broken closed curves in the figure and are adapted to move images of the bubble patterns from the minor loops to an accessing channel in the familiar major-minor organization.

Bubble movement takes place in response to a magnetic field reorienting typically by rotation in plane 11. This in-plane field generates changing pole patterns in the permalloy elements which results in localized field gradients which move the bubble pattern in a well-understood manner. A source of the in-plane field is represented by block 12 in FIG. 1.

Bubble operation occurs in the presence of a bias field antiparallel to the magnetization of a bubble. A source of such a bias field is represented by block 13 in FIG. 1. In actuality, the in-plane field, in each orientation aligned with an elongated portion of a T or bar-shaped element, is operative to produce poles in permalloy elements which modify this bias field locally to produce the gradients which move the bubble pattern. Therefore, the interplay between the bias and the in-plane field is not a casual matter but is determinative of the stable movement of information in the memory.

Figure 2:
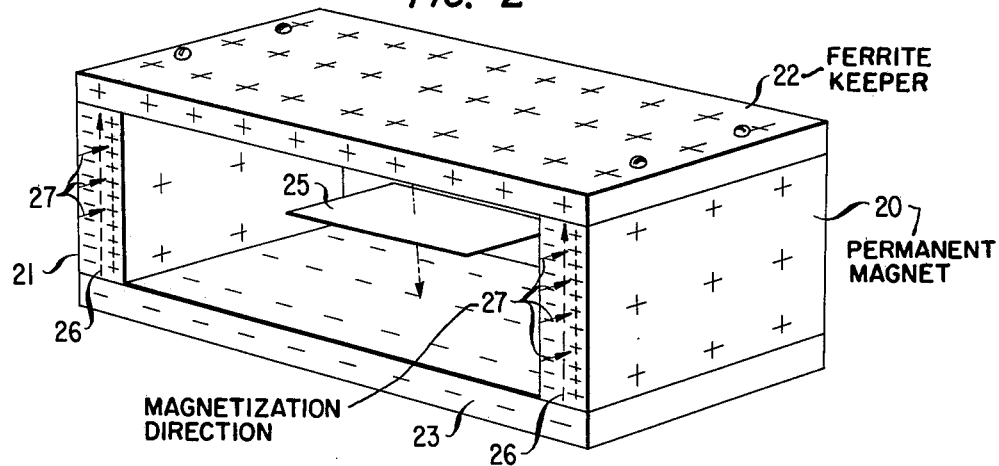
FIGS. 2 and 3 are schematic representations of bias magnet structures, in accordance with this invention, for supplying bias and in-plane fields for the memory of FIG. 1.

FIG. 2 shows a Watson magnet, in accordance with one embodiment of this invention, including two high coercive force permanent magnets 20 and 21 arranged parallel to one another. The magnets are bridged by two ferrite keepers 22 and 23 forming a rectangular cavity in which the plane of bubble movement is maintained as indicated by rectangle 25. In prior art structures, elements 20 and 21 are saturated magnetically in a direction parallel to the broad faces thereof, a direction indicated by broken arrow 26. As a consequence, no dipoles are generated along the broad faces of the elements. In accordance with this embodiment of this invention, elements 20 and 21 are saturated at an angle to the broad faces thereof, a direction indicated by arrows 27. As a consequence, dipoles are formed between the broad faces of elements 20 and 21 and these dipoles give rise to a magnetic field in the plane of rectangle 25 (layer 11 of FIG. 1).

Figure 3:
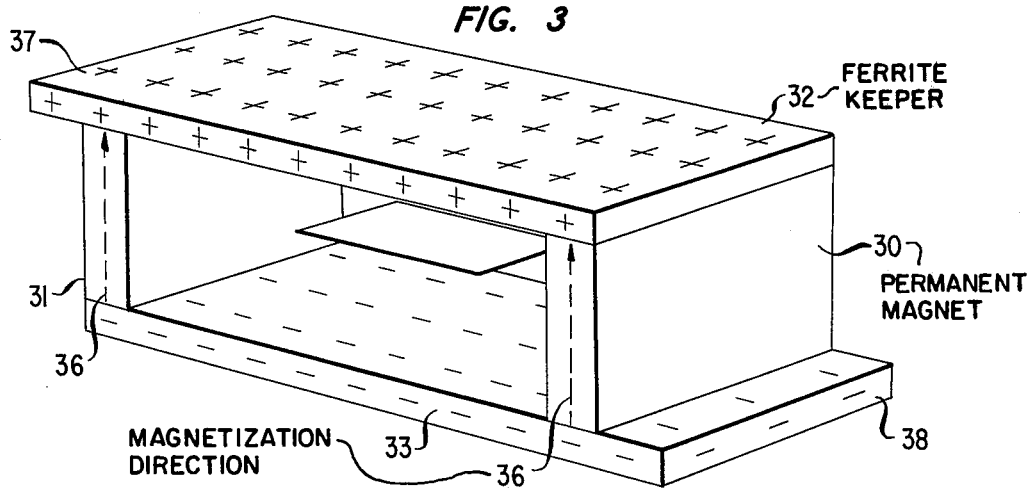

FIG. 3 shows a Watson magnet in accordance with another embodiment of this invention. Here, the magnet structure comprises permanent magnets 30 and 31 again with keepers 32 and 33 bridging the magnets. In this instance, however, the keepers extend beyond the planes of the permanent magnets, keeper 32 extending beyond magnet 31 to the left as viewed and keeper 33 extending beyond magnet 30 to the right as viewed. Magnets 30 and 31 are magnetized parallel to the broad faces thereof as indicated by broken arrows 36. Yet, extra positive poles are formed in the cantilevered portion 37 of keeper 32 and extra negative poles are formed in the cantilevered portion 38 of keeper 33. The additional poles generate the in-plane field for margin enhancement during stop-start operation.

It may be recognized that the angle of the magnetization of magnets 20 and 21 or the extensions of keepers 32 and 33 beyond magnets 30 and 31 is achieved at no additional cost during manufacture. Moreover, it is also well understood that the resulting field is of a holding type useful during start-stop operation. We will now relate the field strength to the bias structure geometries and to the normal bias and rotating fields and show that the field is helpful during normal operation.

The typical Watson magnet for providing a bias field for magnetic bubble operation includes keepers 180 mils apart and permanent magnets 300 mils apart, housing at least one chip and frequently more in plane 25. Each chip includes from several thousand to $0.25 \times 10^6$ bits. The permanent magnets are about 50 mils thick. The normal rotating field strength is about 30 oersteds and the normal bias field is between 90 and 100 oersteds. In the embodiment of FIG. 2 where the permanent magnets are magnetized at an angle to the faces of the magnets, the magnetization is set typically at between 5° and 10° (typically 7°) with respect to the face of the magnet. This provides an average 3 oersted field for a bubble chip $100 \times 100$ mils. The actual value of the in-plane field, of course, depends on the bubble collapse field. If the collapse field is high, the permanent magnet has to be stronger and the angle may be smaller for providing a given in-plane field strength. The angle is set conveniently by setting the magnets between the jaws of a C-shaped electromagnet with the jaws slightly offset from one another. The magnet is then saturated along the angle dictated by the offset. Thereafter, the electromagnet is pulsed in the opposite direction to reduce the magnetization to the midpoint of the device stability range. For embodiments of the type shown in FIG. 3, the keepers overlap by about 50 mils (the thickness of the permanent magnet) to produce a like in-plane field. The result in either embodiment is to add an in-plane field component which constitutes the dc holding field.

The in-plane field is aligned along the axis of the minor loops (parallel to the tops of the T-shaped elements) in FIG. 1. The reason for this alignment is to compensate for the characteristic offset in the center of the nominally circular bubble drive (rotating) field. That field is generated illustratively by $x$ and $y$ tuned circuits driven 90° out of phase with one another. In practice, particularly for repertory dialer type bubble memories, the tuned circuits are refreshed each cycle as is disclosed in copending patent application Ser. No. 591,820, filed for W. Hess-G. P. Vella-Coleiro on June 30, 1975. With tuned circuits characterized by finite Q's, if we refresh at $x=0$, the current in the capacitor of one circuit builds up and peaks at a later time while the current in the capacitor of the other circuit builds up 90° later. The average in-plane field vector is some intermediate value along the $+x$ axis (coincident with the axis of the minor loops). The vector increases and becomes a maximum as it aligns with the $-x$ axis. The holding field is aligned to augment the rotating field vector at its weakest point and to reduce the field at its peak, thus providing a more nearly circular field.

If we consider the magnitudes of the fields generated by two tuned circuits arranged to be refreshed during each cycle of operation, the significance of an in-plane dc field is perhaps easier to understand. Consider circuits with a Q of about 10 and a 30 oersted drive field at a maximum along say the $+x$ direction. The field typically decays to 0.8 that value or 24 oersteds in the $-x$ direction prior to refresh. It is clear then that a 3 oersted dc field in the $-x$ direction compensates for the difference in magnitude between the $+x$ and $-x$ directions.

Similarly, a difference occurs in the field intensities generated along the $y$ axis. Consequently, a dc component of $3/\sqrt{2}$ oersteds at a 45° angle to the $-x$ and $-y$ axes is obviously advantageous to compensate for the varying field intensities generated by the drive circuits. For systems in which the two tuned circuits are coupled together as disclosed in the above-mentioned Bobeck application, the preferred orientation for the dc in-plane field may be slightly different. Whatever the angle, it is arranged to coincide with that of the holding field as dictated by stop-start operation.

What has been described is considered merely illustrative of the principles of this invention. Therefore, various modifications thereof can be devised by those skilled in the art in accordance with those principles within the spirit of the invention as encompassed by the following claims.

What is claimed is:

1. A magnetic bubble memory comprising a layer of material in which magnetic bubbles can be moved in the presence of a bias field antiparallel to the magnetization of a bubble in said layer and bias magnet means for providing said bias field, said means including first and second permanent magnets and first and second keepers arranged to form a cavity occupied by said layer and adapted to supply a uniform said bias field throughout said layer, said keepers being offset from one another in a manner to supply a magnetic field component in the plane of said layer.

2. A magnetic bubble memory comprising a layer of material in which magnetic bubbles can be moved in the presence of a bias field antiparallel to the magnetization of a bubble in said layer and bias magnet means for providing said bias field, said bias magnet means including first and second permanent magnets and first and second keepers arranged to form a cavity occupied by said layer and adapted to supply a uniform said bias field throughout said layer, each of said permanent magnets having a broad surface, each of said magnets being magnetized at an angle to said surface.

3. A bias magnet for a magnetic bubble memory comprising first and second permanent magnets and first and second keepers arranged to provide a uniform magnetic field in a cavity formed thereby, said first and second keepers extending beyond said first and second permanent magnets, respectively, to define cantilevered portions in a manner to generate a surplusage of magnetic poles of first and second polarities in said cantilevered portions of said first and second keepers, respectively.

4. A bias magnet for a magnetic bubble memory comprising first and second permanent magnets and first and second keepers arranged to provide a uniform magnetic field in a cavity formed thereby, each of said permanent magnets having a broad surface and being magnetized at an angle to said broad surface.

5. A combination in accordance with claim 7 in which said elements define safe positions to which bubbles are driven when said in-plane field stops or starts, said safe positions being occupied when said field component is in said second direction.

6. A magnetic bubble memory comprising a layer of material in which magnetic bubbles can be moved in the presence of a bias field antiparallel to the magnetization of a bubble in said layer and bias magnet means for providing said bias field, said means including first and second permanent magnets and first and second keepers arranged to form a cavity occupied by said layers and adapted to supply a uniform said bias field throughout said layer, said keepers being arranged in parallel planes parallel to the plane of said layer, said permanent magnets being magnetized and disposed in a manner to provide a magnetic field in the plane of said layer.

7. A magnetic bubble memory in accordance with claim 6 wherein said layer has formed thereon elements defining paths for bubble movement in response to a magnetic field reorienting cyclically in the plane of said layer, said path being aligned along an axis having first and second directions along which said reorienting field are of maximum and minimum intensities, said permanent magnets being adapted to provide a constant magnetic field component in said first direction of an intensity equal to half the difference between said maximum and minimum intensities.

8. A magnetic memory in accordance with claim 6 in which said keepers are offset from one another in a manner to supply a magnetic field component in the plane of said layer.

9. A magnetic memory in accordance with claim 6 in which each of said permanent magnets has a broad surface and is magnetized at an angle to said surface.

10. A magnetic memory in accordance with claim 6 in which said first and second keepers extend beyond said first and second permanent magnets, respectively, to define cantilevered portions in a manner to generate a surplusage of magnetic poles of first and second polarities in said cantilevered portions of said first and second keepers, respectively.

* * * * *